(12) United States Patent
Rouaissia

(10) Patent No.: US 9,628,594 B2
(45) Date of Patent: Apr. 18, 2017

(54) METHOD AND DEVICE FOR CAPACITIVE NEAR-FIELD COMMUNICATION IN MOBILE DEVICES

(71) Applicant: Semtech Corporation, Camarillo, CA (US)

(72) Inventor: Chaouki Rouaissia, Neuchatel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/530,115

(22) Filed: Oct. 31, 2014

(65) Prior Publication Data
US 2016/0127523 A1    May 5, 2016

(51) Int. Cl.
*H04B 1/38* (2015.01)
*H04M 1/02* (2006.01)
(Continued)

(52) U.S. Cl.
CPC .......... *H04M 1/0266* (2013.01); *G06F 3/044* (2013.01); *H04B 5/0012* (2013.01); *H04B 5/0031* (2013.01); *G06F 2203/04107* (2013.01); *H03K 17/955* (2013.01); *H04M 1/7253* (2013.01); *H04M 2250/12* (2013.01); *H04M 2250/22* (2013.01)

(58) Field of Classification Search
CPC . G11C 16/0483; G11C 16/26; G11C 11/5642; G11C 16/0433; G06F 11/1008
USPC ........................................................ 455/566
See application file for complete search history.

(56) References Cited

U.S. PATENT DOCUMENTS 5,860,013 A * 1/1999 Chan ..................... H01L 27/118
257/E27.105
7,884,648 B2 * 2/2011 Broyde ............... H04L 25/0276
326/82

(Continued)

FOREIGN PATENT DOCUMENTS

WO  2012058724 A1  5/2012
WO  2014113936 A1  7/2014

OTHER PUBLICATIONS

Analog Devices, Inc., "24-Bit Capacitance-to-Digital Converter with Temperature Sensor", pp. 1-28, 2007.

(Continued)

*Primary Examiner* — Don N Vo
(74) *Attorney, Agent, or Firm* — Brian M. Kaufman; Robert D. Atkins; Patent Law Group: Atkins & Associates, P.C.

(57) ABSTRACT

A mobile device includes a conductive element and a ground node. The conductive element is configured to be detected by a proximity sensor. A switch is coupled between the conductive element and ground node. The conductive element is coupled to the ground node by closing the switch. A first memory element is configured to control the switch. The first memory element includes a register bit coupled to a control terminal of the switch. A data output is configured to control the switch. A FIFO is configured to provide data to the data output. The first memory element includes a FIFO. A capacitive touch controller is configured to measure a capacitance of the conductive element. A digital processing unit is configured to convert the capacitance of the conductive element to a bit of data. A second memory element is configured to store the bit of data.

25 Claims, 10 Drawing Sheets

(51) Int. Cl.
G06F 3/044 (2006.01)
H04B 5/00 (2006.01)
H03K 17/955 (2006.01)
H04M 1/725 (2006.01)

(56) References Cited

U.S. PATENT DOCUMENTS

| | | | |
|---|---|---|---|
| 8,860,686 B2* | 10/2014 | Simmons | G06F 3/0416 178/18.03 |
| 2008/0143609 A1* | 6/2008 | Mashima | H01Q 1/243 343/702 |
| 2008/0267258 A1* | 10/2008 | Hokenmaier | G01K 7/425 374/166 |
| 2012/0063445 A1* | 3/2012 | Sim | H04B 15/02 370/347 |
| 2012/0214412 A1 | 8/2012 | Schlub et al. | |
| 2012/0293216 A1* | 11/2012 | Muza | H02M 3/158 327/109 |
| 2013/0316766 A1* | 11/2013 | Nousiainen | H04B 1/3816 455/558 |

OTHER PUBLICATIONS

Cypress Semiconductor, "PSoC 4 Capsense Design Guide", pp. 1-101, Apr. 19, 2013.
Semtech Corporation, "Wireless & Sensing", pp. 1-39, Feb. 5, 2014.

* cited by examiner

METHOD AND DEVICE FOR CAPACITIVE NEAR-FIELD COMMUNICATION IN MOBILE DEVICES

FIELD OF THE INVENTION

The present invention relates in general to wireless communication and, more particularly, to a method and device for capacitive near-field communication in mobile devices.

BACKGROUND OF THE INVENTION

Smartphones and other mobile devices have rapidly become ubiquitous throughout the world. Mobile phones and tablet computers are commonly seen in use at restaurants, in waiting rooms, or on street corners. Mobile devices are used for gaming, photography, listening to music, social networking, or simply talking with another person via a built in microphone and speaker.

Mobile devices enrich lives by keeping family and friends in communication, allowing any moment to be captured as a photo or video, and providing a means of contacting someone in an emergency situation. FIG. 1a illustrates a mobile device 10. Mobile device 10 is a touchscreen slate cellular (cell) phone. In other embodiments, mobile device 10 is a tablet computer, pager, GPS receiver, smartwatch or other wearable computer, laptop computer, handheld game console, or any other device capable of radio communication.

Mobile device 10 includes touchscreen 12 on a front side of the mobile device. Touchscreen 12 is used to display a graphical user interface (GUI). The GUI on touchscreen 12 presents feedback, notifications, and other information to a user as determined by an operating system of mobile device 10. Touchscreen 12 is sensitive to physical touch from body parts of a user of mobile device 10. Touchscreen 12 utilizes resistance, capacitance, acoustic waves, an infrared grid, optical imaging, or other methods to determine the presence and location of a user's touch.

In one common usage scenario of mobile device 10, touchscreen 12 displays a button as a part of the GUI, and a user touches the location of the button on the touchscreen to perform an action associated with the button. In one embodiment, touchscreen 12 displays a 3×4 telephone keypad. A user dials a telephone number on the displayed keypad by touching touchscreen 12 at the locations where the desired numbers to dial are displayed. Touchscreen 12 displays an alphanumeric keyboard along with, or as an alternative to, the telephone keypad, with a user touching the touchscreen in the location of letters, numbers, or symbols to be entered in a text input field displayed on the touchscreen. Touchscreen 12 is also used to watch downloaded or streamed videos, or play games, with a user's touch controlling playback of the video or play of the game. In some embodiments, touchscreen 12 is sensitive to a user's touch when the display component of the touchscreen is disabled. While listening to music, a user pauses the music, or advances to the next track of music, by drawing a symbol on touchscreen 12 even though nothing is displayed on the touchscreen.

Buttons 14 provide an alternative user input mechanism to touchscreen 12. Buttons 14 perform functionality depending on the programming of the operating system running on mobile device 10. In one embodiment, buttons 14 return the GUI on touchscreen 12 to a home screen, go back to a previous GUI screen, or open up a menu on the GUI. In other embodiments, the functionality of buttons 14 changes based on a context displayed on touchscreen 12.

Speaker 16 provides audible feedback to a user of mobile device 10. When mobile device 10 receives an incoming message, speaker 16 produces an audible notification sound to alert a user to the received message. An incoming telephone call causes a ringing sound from speaker 16 to alert the user. In other embodiments, a musical ringtone, selectable via the GUI on touchscreen 12, is played via speaker 16 when an incoming telephone call is received. When mobile device 10 is used to participate in a telephone call, a user of the mobile device speaks into microphone 17 while the other conversation participants' voices are reproduced by speaker 16. When a user watches a movie or plays a game, the sound associated with the movie or game is produced by speaker 16 for the user to hear.

Front facing camera 18 provides visual feedback to the operating system of mobile device 10. Camera 18 creates a digital image of the area facing touchscreen 12. Camera 18 is used in video chat applications running on mobile device 10 to capture video of a user's face during a conversation. Mobile device 10 transmits the video of a user to another mobile device in another location, and receives a streaming video of another person using the other mobile device which is displayed on touchscreen 12. Camera 18 is also used to take selfies or other pictures. When camera 18 is used to take pictures, touchscreen 12 displays the image being captured by the camera so that the touchscreen is an electronic viewfinder. Captured photographs are stored on memory within mobile device 10 for subsequent viewing on touchscreen 12, sharing on social networks, or backing up to a personal computer.

Housing 20 provides structural support and protection for the internal components of mobile device 10. Housing 20 is made of rigid plastic or metallic materials to withstand environmental hazards which cause harm to the circuit boards and other components within mobile device 10 if exposed directly. In one embodiment, a panel of housing 20 opposite touchscreen 12 is removable to expose interchangeable parts of mobile device 10 such as a subscriber identification module (SIM) card, flash memory card, or battery. Housing 20 includes a transparent glass or plastic portion over touchscreen 12, which protects the touchscreen from environmental factors while allowing a user's touch to be sensed through the housing.

FIG. 1b illustrates a user 30 operating mobile device 10 as a telephone. A portion of housing 20 is removed to illustrate antenna 32 within mobile device 10. User 30 holds mobile device 10 with speaker 16 over an ear of the user. Microphone 17 is oriented toward a mouth of user 30. When user 30 speaks, microphone 17 detects and digitizes the user's voice for transmission to a person the user is speaking with. The person that user 30 is speaking with transmits a digitized voice signal to mobile device 10 which is reproduced on speaker 16 and heard by the user. User 30 thereby converses with another person using mobile device 10.

Mobile device 10 sends a voice signal of user 30, and receives a voice signal of a person being conversed with, using a cellular network or other network capable of voice traffic. In various embodiments, mobile device 10 transmits voice signals and other data over Wi-Fi, Bluetooth, GSM, CDMA, LTE, HSPA+, WiMAX, or other wireless network types. Mobile device 10 transmits a voice signal using radio frequency (RF) electromagnetic waves emanating from RF antenna 32. An RF amplifier in mobile device 10 supplies an electric current, which contains the voice information and oscillates at radio frequencies, to antenna 32. Antenna 32 radiates energy of the current as electromagnetic waves through the area surrounding mobile device 10. The electromagnetic waves reach a cellular tower which forwards the voice signal on to ultimately be received by the person that user 30 is conversing with.

FIG. 1c is a block diagram of an RF section 33 of mobile device 10. RF section 33 represents a portion of the circuitry located on a circuit board within mobile device 10. RF section 33 includes microcontroller or central processing unit (CPU) 34, RF transceiver 36, RF amplifier 38, and antenna 32. For mobile device 10 to receive an audio signal or other digital data, radio waves are first received by antenna 32. Oscillating electric and magnetic fields of an incoming radio wave exert force on electrons in antenna 32, causing the electrons to oscillate and creating a current in the antenna. RF transceiver 36 demodulates the incoming signal to eliminate RF frequencies and sends the underlying data to CPU 34.

When mobile device 10 is transmitting data, CPU 34 first provides data to be transmitted. In one embodiment, CPU 34 receives audio data from microphone 17 and performs digital signal processing functions on the audio data. CPU 34 performs any digital signal processing or baseband processing required for the audio data, or a separate digital signal processor (DSP) or baseband integrated circuit (IC) is used. In other embodiments, non-voice data is sent, e.g., an outgoing text message or a uniform resource locator (URL) of a website which user 30 wishes to view on touchscreen 12. Once CPU 34 has received or generated the data to be transmitted, the data is sent from the CPU to RF transceiver 36. RF transceiver 36 generates an RF signal containing the data to be transmitted by modulating the data using the frequency for a network that mobile device 10 is communicating with.

The RF signal is sent from RF transceiver 36 to RF amplifier 38. RF amplifier 38 amplifies the signal from RF transceiver 36 to generate a higher power RF signal for transmission by antenna 32. RF amplifier 38 sends the amplified RF signal to antenna 32. The amplified RF signal causes an oscillating current of electrons within antenna 32. The oscillating electric current creates an oscillating magnetic field around antenna 32 and an oscillating electric field along the antenna. The time-varying electric and magnetic fields radiate away from antenna 32 into the surrounding environment as an RF electromagnetic wave.

The output power of RF amplifier 38 is controlled by CPU 34. CPU 34 controls the strength of an RF signal emanating from antenna 32 by configuring a gain setting of RF amplifier 38. A device receiving radio waves from mobile device 10 can be from a few feet away for in-home Wi-Fi, to a few miles away for rural cellular service, or potentially even further away from the mobile device. A higher gain setting of RF amplifier 38 causes a higher power electromagnetic radio wave to emanate from mobile device 10. A higher power electromagnetic radio wave is received at a location further away from mobile device 10.

Antenna 32 is omnidirectional, i.e., the antenna radiates energy approximately equally in every direction from mobile device 10. An omnidirectional antenna 32 gives mobile device 10 good connectivity with a cellular tower without regard to the angle the mobile device is held at. However, due to the omnidirectional nature of antenna 32, a significant amount of RF electromagnetic radiation from the antenna is radiated into user 30 when the user holds the mobile device near a body part, as illustrated in FIG. 1b. Some health concerns exist in relation to RF radiation from mobile devices, such as mobile device 10, being absorbed by the human body. Some studies suggest that RF energy absorbed by the body may be linked to cancer and other illnesses.

Specific absorption rate (SAR) is a measure of the rate at which energy is absorbed by the human body when exposed to an RF electromagnetic field. SAR measures exposure to electromagnetic fields between 100 kHz and 10 GHz. A SAR rating is commonly used in association with cell phones and magnetic resonance imaging (MRI) scanners.

When measuring SAR due to mobile device 10, the mobile device is placed at the head in a talk position, as illustrated in FIG. 1b. The SAR value is then measured at the location that has the highest absorption rate in the entire head, which is generally the closest portion of the head to antenna 32. In the United States, the Federal Communications Commission (FCC) requires that mobile devices have a SAR level at or below 1.6 watts per kilogram (W/kg) taken over the volume containing a mass of 1 gram of tissue that is absorbing the most RF energy. In Europe, the European Committee for Electrotechnical Standardization (CENELEC) specifies a SAR limit of 2 W/kg averaged over the 10 grams of tissue absorbing the most RF energy.

Regulations limiting the SAR from mobile device 10 in effect limit the RF power of the mobile device when in use near the body of user 30. Limiting RF output limits signal strength and can degrade connectivity of mobile device 10 to cell phone towers. FIGS. 2a-2c show graphs of SAR versus the distance of mobile device 10 from user 30. In FIGS. 2a and 2b, RF amplifier 38 has a constant power output. In FIG. 2a, CPU 34 has configured RF amplifier 38 for high RF power and good connectivity of mobile device 10 to cell phone towers. Line 40 illustrates that with a constant RF power output, SAR is reduced as mobile device 10 is moved further away from user 30, i.e., further right on the graph in FIG. 2a. As mobile device 10 is moved closer to user 30, SAR increases.

Radiation emanating from mobile device 10 attenuates as the radiation travels further away from antenna 32. When mobile device 10 is directly next to the head of user 30, much of the radiation emanating from antenna 32 is concentrated on a small area of the head, resulting in a high SAR. When mobile device 10 is further away from user 30, radiation spreads out and hits a larger area of the user's body at a lower energy level. Much of the radiation which hits user 30 when mobile device 10 is held up to the head will miss the user when the mobile device is held at a distance.

Line 40 shows that when configured for high RF power and good connectivity, mobile device 10 will exceed SAR regulatory limit 42 when the mobile device is held within a distance d of a body part of user 30. In one embodiment, the distance d at which mobile device 10 exceeds SAR regulatory limit 42 when configured for high power output is 10 millimeters (mm). Mobile device 10 as configured in FIG. 2a includes good connectivity but is out of compliance with SAR regulations.

One solution to ensure that the SAR of mobile device 10 remains under regulatory limit 42 is to reduce the RF output power of the mobile device, illustrated by FIG. 2b. Line 44 shows that as mobile device 10 is moved further away from user 30, SAR is reduced, as with the configuration of FIG. 2a. However, in FIG. 2b, mobile device 10 is configured for a lower RF output, and does not exceed SAR regulatory limit 42 when the mobile device is held against user 30. The lower RF output makes mobile device 10 in compliance with SAR regulations, but reduces connectivity of the mobile device.

FIG. 2c illustrates another solution to maintaining the SAR of mobile device 10 under regulatory limit 42. When mobile device 10 is held at a distance greater than d from user 30, RF power output of the mobile device, illustrated by line 46, is at a level similar to the higher power setting illustrated in FIG. 2a. When mobile device 10 is moved within a distance d of user 30, i.e., the distance at which SAR would exceed regulatory limit 42 in the configuration of FIG. 2a, the RF output of the mobile device is reduced to remain under the regulatory limit. The reduced RF output within distance d is illustrated by line 48, which is similar to line 44 of FIG. 2b. As configured in FIG. 2c, mobile device 10 includes good connectivity when held a distance greater than d from user 30, and a reduced RF output to remain under SAR regulatory limit 42 when held within a distance d of the user.

To implement the configuration illustrated in FIG. 2c, mobile device 10 includes a proximity sensor used to detect distance from user 30. When the proximity sensor detects user 30 is within a distance d of the proximity sensor, CPU 34 reduces the RF power output of RF amplifier 38 to prevent the SAR of mobile device 10 from rising above regulatory limit 42. When the proximity sensor detects no human body within a distance d of mobile device 10, CPU 34 increases RF power output to improve connectivity.

FIG. 3a illustrates mobile device 10 with a portion of touchscreen 12 removed to reveal near-field communication (NFC) loop antenna 50 and NFC chip 52. NFC loop antenna 50 is significantly smaller than the wavelength of the carrier signal used for communication over the NFC loop antenna. The short length of NFC loop antenna 50 compared to the wavelength of a carrier signal reduces the magnitude of electromagnetic waves radiating from the NFC loop antenna while still producing significant magnetic or electric fields near the loop antenna. Inductive coupling between NFC loop antenna 50 of mobile device 10 and another device with an NFC loop antenna allows communication between the two devices.

NFC technology is used, as illustrated in FIG. 3b, for communication between two mobile devices, such as mobile device 10 and mobile device 54. User 30 can transfer files or other data between mobile device 10 and mobile device 54 by holding the mobile devices within a few inches and initiating NFC communication. In some embodiments, NFC communication is automatically triggered when two devices with NFC are within range of each other. When mobile device 54 is detected near NFC loop antenna 50 of mobile device 10, touchscreen 12 displays various options user 30 can choose from to utilize the NFC connection.

While NFC enables useful functionality of mobile device 10, NFC loop antenna 50 and NFC chip 52 add a significant cost to mobile device 10 in terms of the area required for parts as well as manufacturing cost and complexity. NFC capability requires not only the addition of NFC loop antenna 50 and NFC chip 52, but a number of other parts such as resistors and capacitors are required in mobile device 10 to make NFC work. In addition, transmitting over NFC loop antenna 50 draws a significant amount of current, which drains battery power of mobile device 10.

One goal of mobile device manufacturers is to reduce the number of parts used in mobile devices. Reducing the number of parts in a mobile device allows the mobile device to be manufactured thinner and more lightweight, which are characteristics desired by today's consumers. Reducing the number of parts also reduces the cost and complexity of manufacturing mobile devices, which increases profits for manufacturers and reduces the price for consumers.

One way which manufacturers reduce the number of parts used to make a mobile device is to use existing parts to add new functionality, or to use a single part for multiple functions which previously required multiple parts. Challenges exist in combining functionality to use less parts. Many times, a part is not useable for the multiple functions at one time, so the functions must be time multiplexed. Time multiplexing means that while a part is used for multiple functions, the part is only used for one of the functions at any given time. Another challenge to combining functionality to use less parts is adapting existing technology to new uses. In some cases, the modifications necessary to use an existing part for a new function are not obvious, or require changes to integrated circuit modules.

SUMMARY OF THE INVENTION

A need exists to enable communication between a mobile device and other nearby devices without adding parts and complex circuitry to the mobile device. Accordingly, in one embodiment, the present invention is a method of making a mobile device comprising the steps of providing a conductive element, providing a ground node, providing a switch coupled between the conductive element and ground node, providing a first memory element configured to control the switch, and providing a capacitive touch controller configured to measure a capacitance of the conductive element.

In another embodiment, the present invention is a method of making a mobile device comprising the steps of providing a conductive element, providing a ground node, providing a switch coupled between the conductive element and ground node, and providing a first memory element configured to control the switch.

In another embodiment, the present invention is a method of making a mobile device comprising the steps of providing a conductive element, providing a ground node, and providing a switch coupled between the conductive element and ground node.

In another embodiment, the present invention is a mobile device comprising a conductive element and a ground node. A switch is coupled between the conductive element and ground node.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1A:
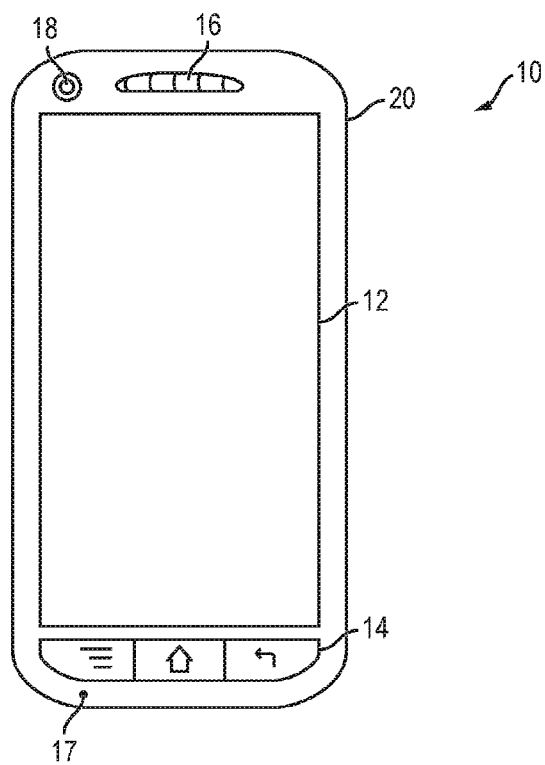
FIGS. 1a-1c illustrate a mobile device with RF transmission capability.
Figure 1B:
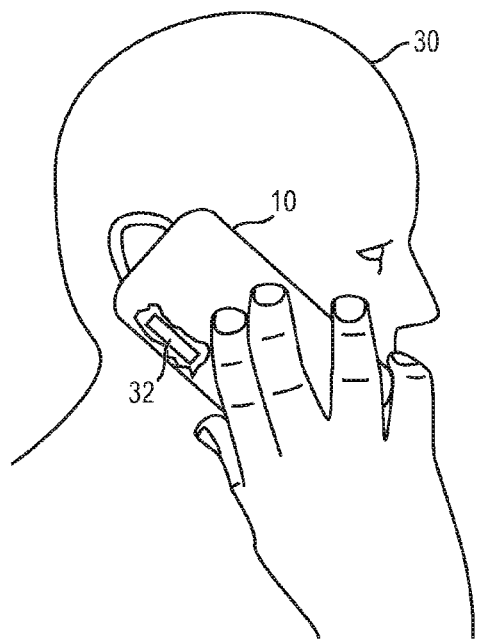
Figure 1C:
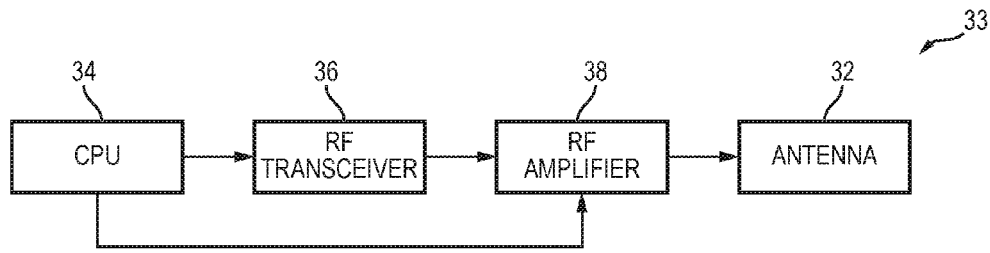
Figure 2A:
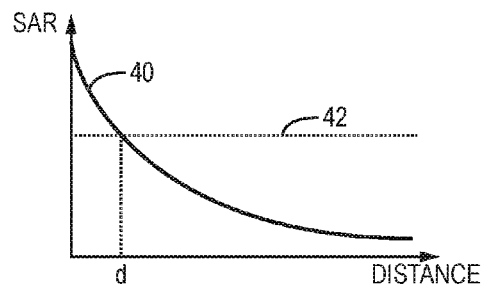
FIGS. 2a-2c illustrate SAR versus distance from a human body for a mobile device with and without the use of a proximity sensor.
Figure 2B:
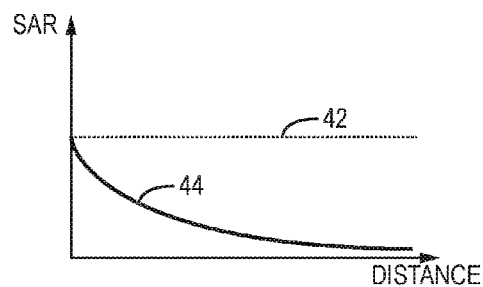
Figure 2C:
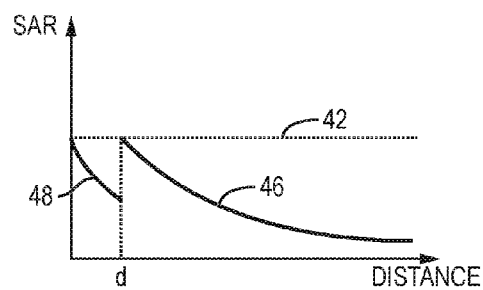
Figure 3A:
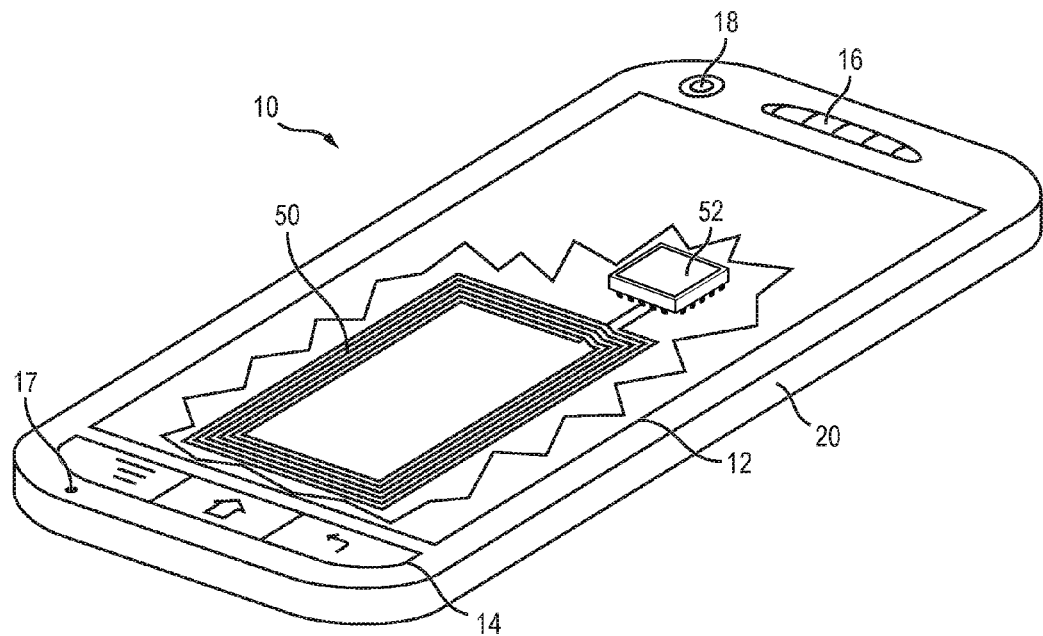
FIGS. 3a-3b illustrate a mobile device including inductive near-field communication capability.
Figure 3B:
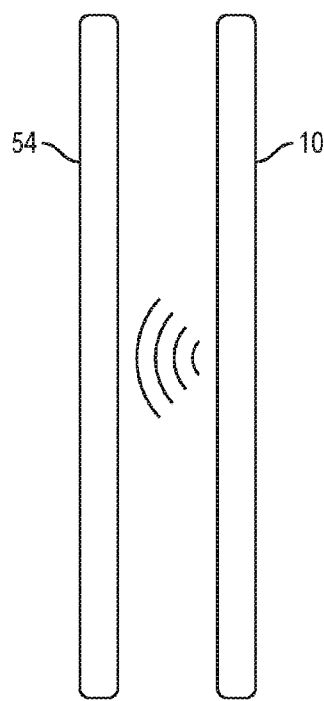
Figure 4A:
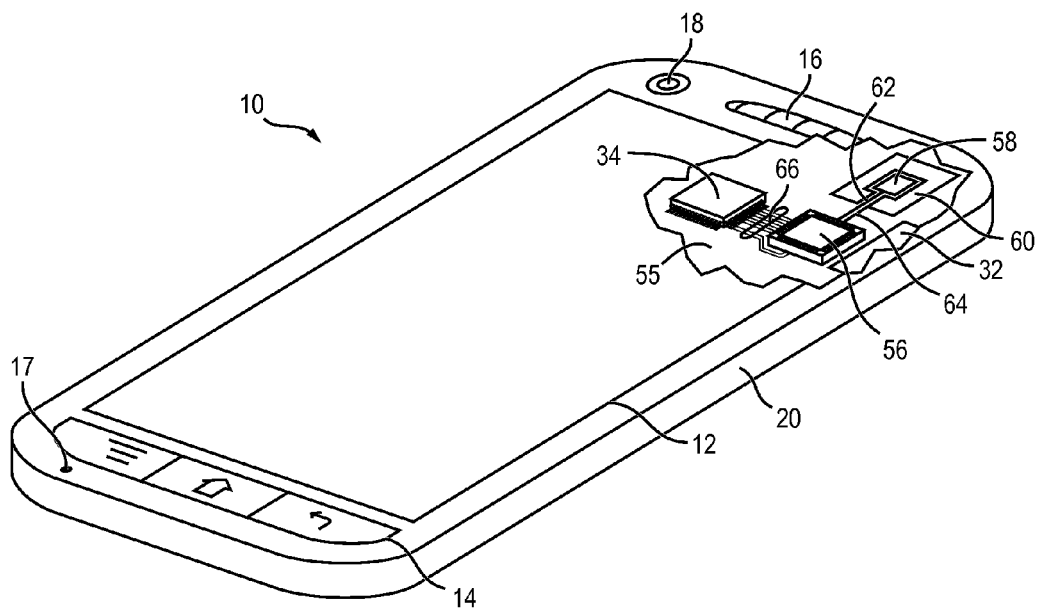
FIGS. 4a-4b illustrate a mobile device including a proximity sensor.

FIG. 4a illustrates mobile device 10 with a portion of touchscreen 12 and housing 20 removed to reveal printed circuit board (PCB) 55 with CPU 34, capacitive touch controller 56, sensing element 58, and shielding area 60 formed or disposed on the PCB. In other embodiments, a flexible printed circuit (FPC) is used instead of PCB 55. Capacitive touch controller 56 and sensing element 58 form a proximity sensor for mobile device 10. In some embodiments, proximity sensors are used which do not require a separate sensing element. Conductive trace 62 connects sensing element 58 to capacitive touch controller 56, while conductive trace 64 connects shielding area 60 to the capacitive touch controller. Conductive traces 66 provide communication between CPU 34 and capacitive touch controller 56.

PCB 55 provides a base for mounting the electronic parts and forming the conductive traces necessary to provide the functionality of mobile device 10. PCB 55 includes other circuit elements and semiconductor packages not illustrated as required to implement the functionality of mobile device 10. PCB 55 includes all the electronic parts necessary for mobile device 10. In other embodiments, the electronic parts for mobile device 10 are split across multiple PCBs. PCB 55 includes additional parts such as a Universal Serial Bus (USB) port, random access memory (RAM), flash memory, a graphics processing unit (GPU), or a system on a chip (SoC).

Capacitive touch controller 56 is an IC designed to measure the self-capacitance, or inherent capacitance, of sensing element 58. Self-capacitance is a capacitance measured between a conductive element, e.g., sensing element 58, and a ground potential. When the conductive object to be detected, e.g., a lap, finger, palm, or face of user 30, is not present near sensing element 58, the self-capacitance of the sensing element, Csensor, is the environmental capacitance, Cenv. Cenv is determined by electric fields from sensing element 58 interacting with the environment near the sensing element. In particular, electric fields from sensing element 58 interact with nearby conductive material such as shielding area 60, traces 62-66, power and ground planes, conductive vias, and ICs. When a body part of user 30 is present near sensing element 58, the self-capacitance of the sensing element, Csensor, is Cenv plus the capacitance attributable to the body part, Cuser. Capacitive touch controller 56 is calibrated with the value of Cenv, and subtracts Cenv from the total self-capacitance of sensing element 58. The remaining capacitance is the self-capacitance attributable to a body part of user 30 in proximity of sensing element 58, i.e., Cuser. In practice, a configurable capacitor bank within capacitive touch controller 56 cancels or counteracts the Cenv contribution to self-capacitance, leaving Cuser to be measured, although other methods of isolating Cuser from Csensor are used in other embodiments.

If Cuser, i.e., the measured self-capacitance of sensing element 58 attributable to user 30, is approximately equal to zero, capacitive touch controller 56 reports to CPU 34 a lack, or absence, of proximity via a memory mapped flag, as well as an interrupt. If Cuser is over a threshold associated with a human body part, capacitive touch controller 56 reports proximity in a similar manner. In addition to a flag indicating proximity or lack thereof, capacitive touch controller 56 reports to CPU 34 a digital value proportional to Cuser for each Cuser measurement, whether proximity is detected or not. CPU 34 uses the proximity flag for simple applications where only proximity or lack of proximity is needed, and uses the digital Cuser value to implement functionality that is more advanced.

Capacitive touch controller 56 senses self-capacitance of sensing element 58 by first using a bank of capacitors to cancel Cenv, and then converting the remaining capacitance, Cuser, to a proportional voltage potential. In some embodiments, the entire self-capacitance of sensing element 58, Csensor, is converted to a proportional voltage and then reduced by a voltage proportional to Cenv. The resulting voltage, proportional to Cuser, is converted to a digital value using an analog to digital converter. The digital Cuser value is processed to determine whether Cuser exceeds a threshold for acknowledging proximity.

Sensing element 58 is a square of copper formed on a surface of PCB 55, although other shapes and other conductive materials are used for the sensing element in other embodiments. In one embodiment, the same physical element is used for both antenna 32 and sensing element 58. In embodiments with a single physical element used for antenna 32 and sensing element 58, a capacitor and inductor are used to filter RF signals from reaching capacitive touch controller 56 and filter lower frequency signals from reaching RF amplifier 38 and RF transceiver 36. In other embodiments, any conductive element is used for sensing element 58.

Sensing element 58 interacts with nearby conductive material, such as conductive traces, vias, and ground planes, as well as a lap, finger, palm, or face of user 30, via electric fields. When a charge is applied to sensing element 58, an opposite charge is attracted toward the sensing element within any nearby conductive material. When the amount of conductive material near sensing element 58 is increased, a greater amount of electric charge is attracted to the sensing element for a given voltage potential of the sensing element. Thus, the self-capacitance of sensing element 58 is a function of the amount of conductive material near the sensing element. Conductive material having a conduction path to a circuit node at a ground potential has a greater effect on self-capacitance because the ground node provides a source of additional charge into the conductive material. Sensing element 58 attracts opposite charge into nearby conductive material through the ground node.

Shielding area 60 provides an electromagnetic shield substantially surrounding sensing element 58. A shielding area formed on a surface of PCB 55 opposite sensing element 58 and shielding area 60 reduces the ability of the sensing element to detect conductive material on a back side of mobile device 10.

Shielding area 60 is electrically connected to capacitive touch controller 56. Capacitive touch controller 56 drives shielding area 60 with a similar voltage potential as sensing element 58 when measuring self-capacitance of the sensing element. In other embodiments, shielding area 60 is electrically connected to a ground potential. Connecting shielding area 60 to ground potential provides an increase to the Cenv component of self-capacitance of sensing element 58. A higher Cenv requires a larger capacitor bank within capacitive touch controller 56 to counteract the higher Cenv. Driving shielding area 60 with a similar voltage potential as sensing element 58 provides a lower Cenv, and reduces the required size of the capacitor bank within capacitive touch controller 56.

Conductive trace 62 connects sensing element 58 to capacitive touch controller 56. In some embodiments, multiple sensing elements are used, with each sensing element separately connected to capacitive touch controller 56 with a different conductive trace. In one embodiment, sensing elements are used to implement buttons 14, with the buttons being activated when proximity of user 30 is sensed on a button. Capacitive touch controller 56 manipulates the voltage of sensing element 58 and detects the self-capacitance of the sensing element via conductive trace 62. Conductive trace 64 connects shielding area 60 to capacitive touch controller 56. Capacitive touch controller 56 controls the voltage of shielding area 60 to be approximately equal to the voltage of sensing element 58 via conductive trace 64.

Conductive traces 66 connect CPU 34 to capacitive touch controller 56. Traces 66 include lines for reset, interrupt, data, address, clock, enable, and other signals necessary for communication between CPU 34 and capacitive touch controller 56. In one embodiment, CPU 34 communicates with capacitive touch controller 56 using the inter-integrated circuit ($I^2C$) protocol. Other communication protocols are used in other embodiments.

Some functions of capacitive touch controller 56 are controlled by CPU 34 using a single conductive trace 66 connected to a pin on the capacitive touch controller, such as enabling or disabling sensing. Other functionality is exercised by CPU 34 reading from or writing to hardware registers within capacitive touch controller 56. A raw Cuser value is read from a memory mapped hardware register internal to capacitive touch controller 56. A register is also used by CPU 34 to set the threshold value of Cuser when capacitive touch controller 56 reports proximity. Some functionality is implemented with a discrete input or output pin on capacitive touch controller 56, as well as a hardware register within the capacitive touch controller. Capacitive touch controller 56 is reset by CPU 34 toggling a reset input pin of the capacitive touch controller, or by the CPU writing to a soft reset register within the capacitive touch controller.

Figure 4B:
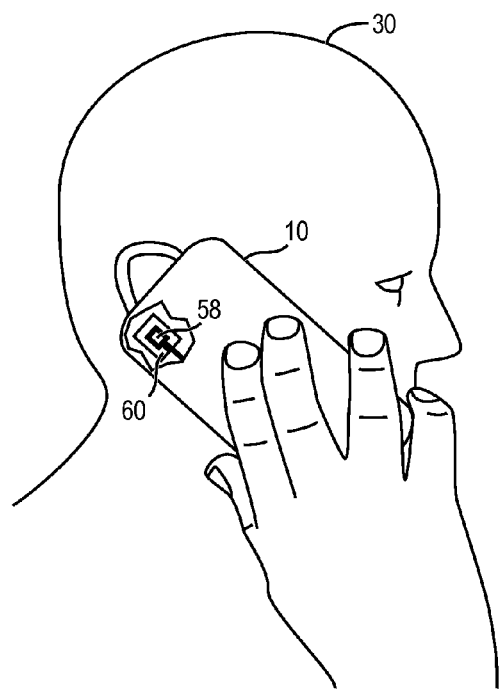

In FIG. 4b, user 30 holds mobile device 10 up to his or her head. The self-capacitance of sensing element 58 increases due to the interaction of electric fields between the sensing element and user 30. Prior to mobile device 10 being disposed in proximity to user 30, the area in front of the mobile device is occupied by air, which has a smaller effect on self-capacitance than the head of the user. Capacitive touch controller 56 detects the rise in self-capacitance of sensing element 58, and notifies CPU 34 of the proximity of user 30. CPU 34 reduces the power output of RF amplifier 38 accordingly so that mobile device 10 remains in compliance with SAR regulations.

Figure 5A:
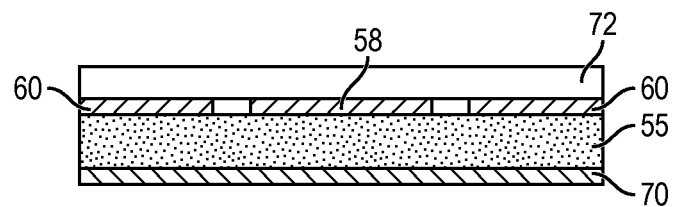
FIGS. 5a-5c illustrate electric fields between a proximity sensing element, surrounding shielding areas, and a human finger.

FIG. 5a is a partial cross-section of PCB 55 illustrating sensing element 58 and optional shielding area 60 formed on a top surface of the PCB. An optional shielding area 70 is formed on a bottom surface of PCB 55 opposite sensing element 58 and shielding area 60. An optional overlay 72 is formed over sensing element 58 and shielding area 60 for physical isolation and protection of the sensing element and shielding area.

PCB 55 is formed from one or more layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Electronic components necessary for the functionality of mobile device 10, such as conductive traces and ICs, are formed or disposed on surfaces of PCB 55. In one embodiment, a multilayer PCB 55 is used which includes electronic components on layers between a top and bottom surface of the PCB. Components at different layers of PCB 55 are connected by conductive vias formed in the PCB.

Sensing element 58 and shielding area 60, as well as traces 62-66 are formed as a layer of metal on PCB 55. In one embodiment, sensing element 58, shielding area 60, and traces 62-66 are formed from a single uniform layer of metal using subtractive methods such as silk screen printing, photoengraving, or PCB milling. In other embodiments, an additive or semi-additive method such as physical vapor deposition (PVD), chemical vapor deposition (CVD), electrolytic plating, electroless plating, or another suitable metal deposition process is used. Shielding area 70 is formed from a similar process as sensing element 58 and shielding area 60.

Sensing element 58, shielding area 60, shielding area 70, and conductive traces 62-66 include one or more layers of aluminum (Al), copper (Cu), tin (Sn), nickel (Ni), gold (Au), silver (Ag), indium tin oxide (ITO), printed conductive ink, or other suitable electrically conductive material. Traces 62-66 are formed on the same surface of PCB 55 as sensing element 58. In other embodiments, traces 62-66 are formed on the surface of PCB 55 opposite sensing element 58, or on an intermediate layer when a multilayer PCB is used. Conductive vias are used to connect traces 62-66 to CPU 34, capacitive touch controller 56, sensing element 58, and shielding area 60 when the traces are not formed on the same surface as sensing element 58. A conductive via connects shielding area 60 to shielding area 70 so that capacitive touch controller 56 drives both shielding areas to a similar voltage potential.

Shielding areas 60 and 70 provide a noise blocking function, as well as directionality for sensing element 58. Shielding areas 60 and 70 provide an electromagnetic shield substantially surrounding sensing element 58 in each direction other than the direction which sensing is desired. Electric fields from sensing element 58 interact with shielding areas 60 and 70, which have a stable effect on self-capacitance, instead of other objects opposite the shielding areas which have a dynamic capacitance with respect to the sensing element. Shielding areas 60 and 70 also reduce electromagnetic noise which impacts the accuracy of the detected capacitance.

Figure 5B:
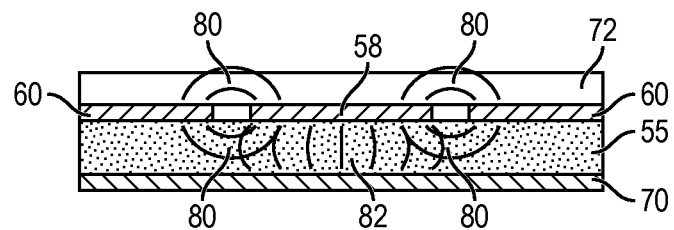
Figure 5C:
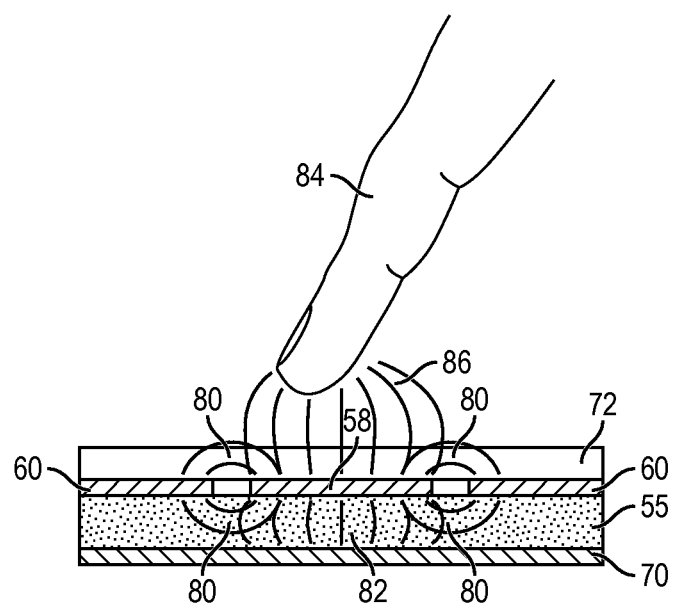

With shielding areas 60 and 70 surrounding sensing element 58 on the bottom and sides, as illustrated in FIGS. 5a-5c, a body part is detected when disposed over sensing element 58 opposite shielding area 70. Shielding area 70 limits the detection capability of capacitive touch controller 56 when a finger or other body part of user 30 is disposed on the back side of PCB 55, i.e., on the opposite side of the PCB from sensing element 58. In some embodiments with an omnidirectional antenna 32, shielding area 70 is not used so that a body part of user 30 is detected whether the body part is on a front or back side of mobile device 10. Without shielding area 70, proximity is detected, and CPU 34 reduces RF power output of mobile device 10, when a body part of user 30 is within proximity on the back side of mobile device 10, e.g., the user sets the mobile device in his or her lap.

Shielding areas 60 and 70 are electrically connected to capacitive touch controller 56. Capacitive touch controller 56 drives shielding areas 60 and 70 to a similar voltage potential as sensing element 58 when sensing self-capacitance of the sensing element. In other embodiments, shielding areas 60 and 70 are electrically connected to a ground potential. Connecting shielding areas 60 and 70 to ground potential provides an increase to the Cenv component of self-capacitance of sensing element 58 due to ground providing a source of charges attracted to the sensing element. A higher Cenv requires a larger capacitor bank within capacitive touch controller 56 to counteract the higher Cenv. Capacitive touch controller 56 driving shielding areas 60 and 70 to a similar voltage potential as sensing element 58 reduces self-capacitance of sensing element 58 by reducing the amount of charge the sensing element attracts in the shielding areas.

Overlay 72 provides physical isolation and protection for sensing element 58. Overlay 72 increases the robustness of mobile device 10 by protecting sensing element 58 from environmental hazards such as dust, dirt, rain, and wind. In one embodiment, overlay 72 is a sheet of plastic or glass integrated into housing 20. Overlay 72 is translucent, transparent, or opaque. Overlay 72 is formed from a material with an electric field permittivity sufficient to allow electric fields to propagate between sensing element 58 and a body part of user 30 disposed in proximity to the sensing element.

FIG. 5b illustrates electric fields between sensing element 58 and shielding areas 60 and 70 when no human body part is in proximity of the sensing element. Electric fields 80 extend between sensing element 58 and shielding area 60. Electric fields 82 extend between sensing element 58 and shielding area 70. Electric fields 80 and 82 are simplified illustrations of the electric fields interacting with sensing element 58. In practice, the electric fields are complex and extend not only to shielding areas 60 and 70, but also to any conductive material, such as conductive vias or conductive traces, near sensing element 58. The environmental self-capacitance, Cenv, of sensing element 58 is a measure of electric fields 80 and 82 from the sensing element interacting with shielding areas 60 and 70 and other conductive material in proximity to the sensing element when user 30 is not in proximity.

When a charge exists on sensing element 58, electric fields 80 and 82 attract an opposite charge within shielding areas 60 and 70 toward the sensing element. A negative charge exists when there is an excess of electrons in the atoms of an object compared to the number of protons. A positive charge exists when there is a deficit of electrons compared to the number of protons. Negatively charged material attracts positive charge, and positively charged material attracts negative charge. When a first object has a positive charge, electrons in nearby conductive objects are attracted to the first object, creating an area of negative charge in the nearby objects. When a first object has a negative charge, electrons in nearby conductive objects are repelled, creating an area of positive charge in the nearby objects. A negative charge and a positive charge are opposites.

In FIG. 5c, finger 84 of user 30 is in the proximity of sensing element 58. While a finger is illustrated, a lap, palm, face, or other conductive object is also capable of being detected. Electric fields 86 attract a charge to the tip of finger 84 that is opposite of a charge on sensing element 58. The charge attracted in finger 84 raises the total amount of charge that must be supplied to sensing element 58 by capacitive touch controller 56 to reach a given voltage potential of the sensing element. As charge per volt is a formula defining capacitance, additional conductive material with additional charge attracted to sensing element 58 raises the self-capacitance of the sensing element. In FIG. 5c, Cenv is represented by electric fields 80 and 82, Cuser is represented by electric fields 86, and Csensor is the sum of Cenv and Cuser.

Capacitive touch controller 56 measures that the self-capacitance of sensing element 58, and thus Cuser, has risen. A flag is set within a hardware register of capacitive touch controller 56, and the capacitive touch controller asserts an interrupt signal to CPU 34. CPU 34 receives the interrupt and executes program code associated with a new proximity reading. In the case of mobile device 10, CPU 34 executes code which reduces RF power output of RF amplifier 38 to prevent exceeding SAR regulatory limit 42. In other embodiments, where capacitive sensing is used to implement buttons 14, CPU 34 executes program code associated with the pressing of a button when proximity is sensed.

Figure 6A:
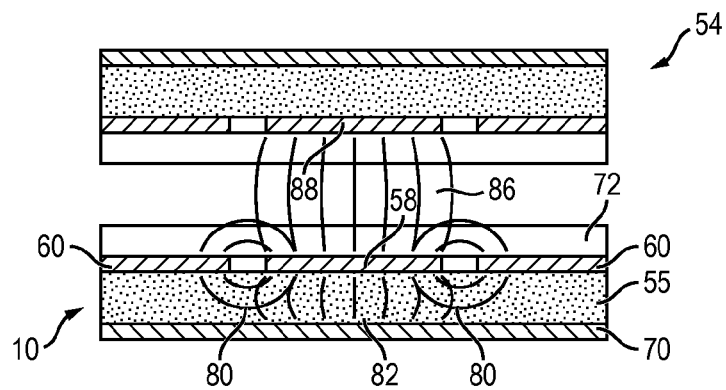
FIGS. 6a-6c illustrate electric fields between a proximity sensing element of a first mobile device and a proximity sensing element of a second mobile device.

Capacitive touch controller 56 uses sensing element 58 to detect proximity of conductive objects other than body parts of user 30. FIG. 6a illustrates sensing element 88 of mobile device 54 placed in proximity to sensing element 58 of mobile device 10. Electric fields 86 interact with sensing element 88, and capacitive touch controller 56 detects that the self-capacitance of sensing element 58 has changed. As capacitive touch controller 56 changes the voltage potential of sensing element 58, an opposite charge is attracted in sensing element 88.

The effect of sensing element 88 on the self-capacitance of sensing element 58 is detected by capacitive touch controller 56 as Cuser. Mobile device 54 is able to control the electrical connectivity of sensing element 88, thereby changing the effect of sensing element 88 on the self-capacitance of sensing element 58. By repeatedly changing the effect of sensing element 88 on the self-capacitance of sensing element 58, mobile device 54 transmits a digital signal to mobile device 10. Mobile device 10 repeatedly senses the self-capacitance of sensing element 58 to receive the digital signal from mobile device 54.

Figure 6B:
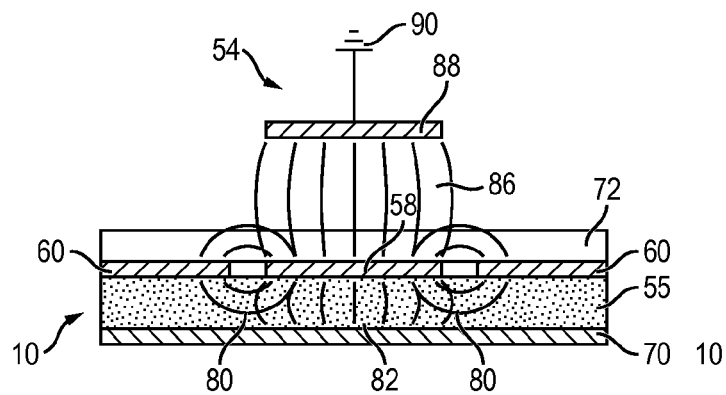
Figure 6C:
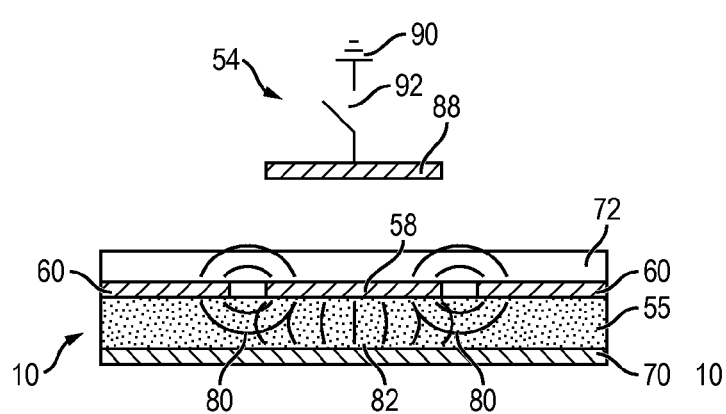

FIGS. 6b and 6c illustrate mobile device 54 modifying the effect of sensing element 88 on the self-capacitance of sensing element 58 to transmit a binary data signal from mobile device 54 to mobile device 10. In FIG. 6b, mobile device 54 has coupled sensing element 88 to ground node 90. Mobile device 54 includes a capacitive touch controller which provides the connection between sensing element 88 and ground node 90. Ground node 90 is a source of charge for sensing element 88. As capacitive touch controller 56 modifies the voltage potential of sensing element 58, an opposite charge is attracted to sensing element 88 via ground node 90. Opposite charge attracted to sensing element 88 through ground node 90 requires that more charge be supplied to sensing element 58 by capacitive touch controller 56 to reach a given voltage potential. Capacitive touch controller 56 recognizes the additional charge supplied to sensing element 58 to reach a given voltage potential as an increase in the Cuser component of self-capacitance. Sensing element 88 connected to ground node 90 has a similar effect on the self-capacitance of sensing element 58 as finger 84 or another body part of user 30.

In FIG. 6c, mobile device 54 has disconnected sensing element 88 from ground node 90 using switch 92. Mobile device 54 puts sensing element 88 in a high impedance, or hi-Z, state by disconnecting sensing element 88 from ground node 90 and other sources of charge. Being in a high impedance state means that the amount of current which flows to or from sensing element 88 is significantly reduced. Switch 92 is formed from one or more transistors within a capacitive touch controller of mobile device 54 operating as a switch. In other embodiments, any method of switching a connection of sensing element 88 between ground and high impedance is used.

Switch 92 reduces the flow of charge to and from sensing element 88. As capacitive touch controller 56 changes the voltage potential of sensing element 58, a significant opposite charge is not attracted into sensing element 88. Mobile device 54 does not provide a source of significant charge into sensing element 88 because switch 92 has disconnected sensing element 88 from ground node 90. As the charge on sensing element 58 changes, any charge already on sensing element 88 is moved around within sensing element 88. However, significant additional charge is not attracted onto sensing element 88 because switch 92 has cut off the supply of charge, i.e., ground node 90. Without additional opposite charge attracted into sensing element 88, the effect of sensing element 88 on the self-capacitance of sensing element 58 is reduced. Capacitive touch controller 56 does not detect a significant increase in Cuser from the proximity of sensing element 88. Opening switch 92 to put sensing element 88 in a high impedance state has a similar effect on the self-capacitance of sensing element 58 as removing finger 84 or another body part of user 30 from the proximity of sensing element 58. Closing switch 92 again to couple sensing element 88 to ground node 90, as illustrated in FIG. 6b, has a similar effect as moving a body part of user 30 back into proximity of sensing element 58.

By successively switching sensing element 88 between being connected to ground node 90 and high-impedance, mobile device 54 transmits a digital data signal to mobile device 10. Mobile device 10 detects the self-capacitance of sensing element 58 at least as fast as mobile device 54 is changing the self-capacitance of sensing element 58 to receive the digital data signal.

The connection between mobile device 10 and mobile device 54 using sensing elements 58 and 88 is a serial communication link. Various protocols, similar to protocols known in the art, are used to transmit data via the serial data connection. Synchronous or asynchronous data transfer modes are used. In one embodiment, a connection of sensing element 88 to ground node 90 corresponds to a logic '1' value while placing sensing element 88 in a high impedance state corresponds to a logic '0' value. Other forms of encoding digital data are used in other embodiments. Various embodiments use start bits, stop bits, parity bits, and data bits in any number and combination to transmit a serial data packet.

Capacitive touch controller 56 includes the capability to connect sensing element 58 to a ground node or to high impedance. Mobile device 54 includes a capacitive touch controller 56 capable of measuring the self-capacitance of sensing element 88. To transmit digital data from mobile device 10 to mobile device 54, sensing element 58 is successively connected between a ground node and high impedance while mobile device 54 measures the self-capacitance of sensing element 88. Mobile device 10 transmits data to mobile device 54 using similar protocols as used by mobile device 54 to transmit to mobile device 10.

Two-way communication is possible by time multiplexing the direction of transmission between mobile device 54 and mobile device 10. Protocols similar to other half-duplex communication methods are used to control the direction of communication. In some embodiments, each mobile device includes two sensing elements used for capacitive NFC which are positioned such that the transmit pad of one mobile device is in a corresponding location to the receive pad on a second mobile device. When mobile device 10 and mobile device 54 are placed face-to-face or back-to-back, mobile device 10 includes a transmitting sensing element in proximity to a receiving sensing element of mobile device 54, and mobile device 10 includes a receiving sensing element in proximity to a transmitting sensing element of mobile device 10.

Figure 7A:
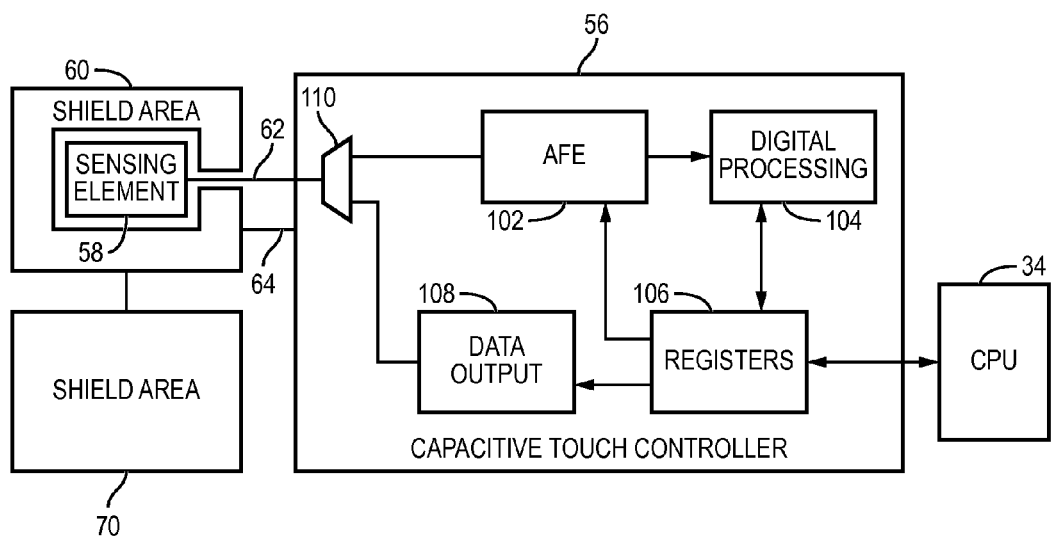
FIGS. 7a-7b illustrate a capacitive touch controller including the capability to transmit data using a sensing element.

FIG. 7a is a block diagram of internal components of capacitive touch controller 56. Analog front-end (AFE) 102 detects the self-capacitance of sensing element 58 and outputs a digital value of the self-capacitance to digital processing unit 104. When data is being received via capacitive NFC, the proximity readings are used to receive the data. Registers 106 contain various hardware registers used by capacitive touch controller 56 to report information to CPU 34, or by the CPU to configure the capacitive touch controller. Data output 108 is used during transmission of data by capacitive touch controller 56 over capacitive NFC. Data output 108 connects sensing element 58 to a ground potential or to a high impedance based on the data to be transmitted. Multiplexer (MUX) or switch 110 couples sensing element 58 to data output 108 when capacitive touch controller 56 is transmitting data to another mobile device via capacitive NFC, and otherwise couples the sensing element to AFE 102 for sensing proximity of user 30 or receiving data via capacitive NFC.

AFE 102 includes a configurable bank of capacitors which are adjusted to approximately cancel the effect of Cenv so that capacitance due to the proximity of external conductive material, Cuser, is isolated and accurately measured. Cuser is the portion of self-capacitance of sensing element 58 attributable to a body part of user 30 when sensing element 58 is used to detect proximity of a user. Cuser is the portion of self-capacitance of sensing element 58 attributable to the sensing element of another mobile device when mobile device 10 is receiving data via capacitive NFC.

A digital value from registers 106 configures the bank of capacitors in AFE 102 based on a prior reading of Cenv. The configurable capacitor bank in AFE 102 is used to generate a voltage approximately proportional to a previously detected Cenv. AFE 102 also generates a voltage approximately proportional to Csensor, i.e., the total self-capacitance of sensing element 58. AFE 102 subtracts the voltage proportional to Cenv from the voltage proportional to Csensor to produce a voltage approximately proportional to Cuser. The voltage proportional to Cuser is converted to a digital value by an analog-to-digital converter within AFE 102 and output to digital processing unit 104. Cuser, Csensor, and Cenv are each different values of the capacitance of the proximity sensor formed from capacitive touch controller 56 and sensing element 58.

Digital processing unit 104 receives a digital value approximately proportional to Cuser from AFE 102 and writes the value to a hardware register in registers 106. The digital Cuser value written to a register in registers 106 is available to CPU 34 by reading the register. A different digital value, stored in a hardware register of registers 106 and configured by CPU 34, indicates a threshold Cuser must reach in order for capacitive touch controller 56 to report proximity to CPU 34. If the digital Cuser value from AFE 102 exceeds the threshold value from registers 106, digital processing unit 104 causes a proximity status flag in registers 106 to become a logic '1', and CPU 34 is interrupted for handling of the proximity event.

Digital processing unit 104 stores a digital value of Cuser in registers 106 each time the self-capacitance of sensing element 58 is converted to a new Cuser value. In one embodiment, digital processing unit 104 stores the raw Cuser value from AFE 102 in registers 106. In other embodiments, digital processing unit 104 adjusts the Cuser value before storage in registers 106, e.g., by adjusting Cuser for drift of Cenv or by filtering high frequency noise.

Registers 106 contain various memory mapped hardware registers used by CPU 34 to configure capacitive touch controller 56, or by the capacitive touch controller to report proximity and other information to the CPU. Some hardware registers of registers 106 are set by a manufacturer for configuration aspects which the manufacturer desires to set permanently for the lifetime of mobile device 10, or until modified by a manufacturer's update. Registers 106 include interrupt request (IRQ) bits used to notify CPU 34 when the proximity status of user 30 has changed, i.e., the user has entered or left the proximity of sensing element 58. Registers 106 also include IRQ bits for completion of a new reading of Cuser or a new calibration of Cenv. Registers 106 are used by CPU 34 to set a threshold value of Cuser when proximity is considered detected, to reset capacitive touch controller 56, and to set a frequency at which periodic capacitance readings are to occur, among other uses.

Registers 106 include read-only registers set by a manufacturer of mobile device 10. One read-only register is used to store a reference Cenv reading, which the manufacturer calculates with mobile device 10 in a known state. The reference Cenv reading is used to verify subsequent Cenv readings were validly made without user 30 in proximity, and is also used to detect proximity when no other value of Cenv is available. Another read-only register in registers 106 is used to store a temperature coefficient of the self-capacitance of sensing element 58. The self-capacitance of sensing element 58 has an approximately linear relationship with the temperature of mobile device 10. A coefficient defining the relationship between the self-capacitance of sensing element 58 and the temperature of mobile device 10 is stored in registers 106 for use by digital processing unit 104 to accurately adjust Cuser readings to account for temperature changes.

Registers 106 include a status bit indicating whether the most recent measurement of Cuser indicated that user 30 was in proximity. CPU 34 reads the status bit at any point to determine the proximity status of user 30. A logic '0' indicates user 30 is not in proximity of mobile device 10, and a logic '1' indicates the user is in proximity. In some embodiments, when in capacitive NFC mode, CPU 34 reads the status bit in registers 106 to determine the latest bit of data from another device. In other embodiments, registers 106 contains a data register or FIFO for received data, and CPU 34 reads one or more bytes of data out of registers 106 at a time.

A FIFO, which is an acronym for first in first out, is a memory device which holds multiple bytes or words of data. As data is received a bit at a time by sensing proximity, data processing unit 104 collects the bits into bytes or words and stores the data in the FIFO. CPU 34 is notified that data is available in the FIFO, while capacitive touch controller 56 continues to receive data via capacitive NFC and store the data in the FIFO. CPU 34 reads the received data from the FIFO in the order which data processing unit 104 writes the data into the FIFO until the FIFO is empty of data.

Data output 108 includes a switch which connects sensing element 58 to a ground node or puts the sensing element into a high impedance state. The switch in data output 108 controls whether sensing element 58 will be detected by another nearby sensing element. When data output 108 connects sensing element 58 to a ground node, the sensing element is detected by another device. When data output 108 puts sensing element 58 in a high impedance state, the sensing element is not detected by the other device.

Data output 108 reads or receives data to be transmitted over capacitive NFC from registers 106. In one embodiment, data output 108 receives a single bit at a time and toggles the connection between sensing element 58 and a ground node accordingly. In other embodiments, data output 108 handles an entire byte or word at a time. A multi-bit bus transfers data to be transmitted into data output 108, and data output 108 transfers each bit one at a time by switching the connection between sensing element 58 and ground accordingly.

MUX 110 switches sensing element 58 between being coupled to AFE 102 and being coupled to data output 108. If mobile device 10 is transmitting data to another device over capacitive NFC, MUX 110 connects sensing element 58 to data output 108. AFE 102 is disconnected from sensing element 58. If mobile device 10 is receiving data from another device via capacitive NFC, or detecting proximity of user 30, MUX 110 connects AFE 102 to sensing element 58 for measurement of self-capacitance. Data output 108 is disconnected from sensing element 58. MUX 110 is not used in embodiments with separate sensing elements for transmitting and receiving data. AFE 102 is connected to one sensing element, while data output 108 is connected to another sensing element.

Figure 7B:
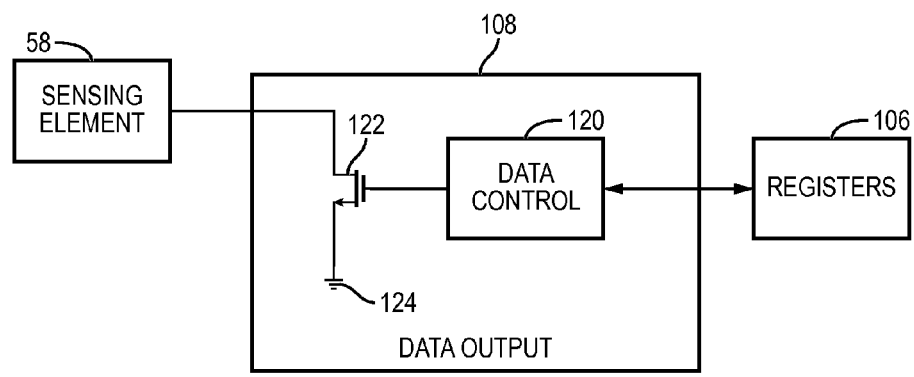

FIG. 7b illustrates data output 108 in detail. Data control 120 receives data from registers 106 which is to be transmitted via capacitive NFC. Switch 122 connects sensing element 58 to ground node 124, or disconnects the sensing element from the ground node so that the sensing element is in a high impedance state.

In one embodiment, data control 120 gets one bit at a time from registers 106. If the bit from registers 106 is a logic '1', data control 120 closes switch 122 so that sensing element 58 is detected by another mobile device's proximity sensor, thereby communicating a logic '1' to the other mobile device. If the bit from registers 106 is a logic '0', data control 120 opens switch 122 so that sensing element 58 is not connected to ground node 124. Sensing element 58 is at high impedance and is not detected by another mobile device's proximity sensor. The other mobile device understands that a logic '0' is being transmitted.

In another embodiment, data control 120 contains a memory device which can hold a byte or word of data from registers 106. Data control 120 reads or receives a byte or word of data from registers 106 and toggles switch 122 accordingly to transmit the data one bit at a time. Once the byte or word is transmitted, data control 120 reads or receives another byte or word from registers 106 if more data needs to be transmitted.

Switch 122 is an N-channel MOSFET with a drain terminal coupled to sensing element 58, a source terminal coupled to ground node 124, and a gate terminal coupled to data control 120. The gate terminal of switch 122 is a control terminal of switch 122, and controls current between the source and drain terminals. The source and drain terminals of switch 122 are conduction terminals. In other embodiments, other types of electrical switches are used. When data control 120 outputs a logic '1', i.e., a positive voltage, to the gate terminal of switch 122, an inversion layer is created within the N-channel MOSFET which creates a conductive channel for current between sensing element 58 and ground node 124. Sensing element 58 is detected by another mobile device, and a logic '1' is transmitted via capacitive NFC. When data control 120 outputs a logic '0', i.e., a voltage approximately equal to ground potential, the channel in the N-channel MOSFET of switch 122 is closed, reducing the ability of electrical current to flow between ground node 124 and sensing element 58. Sensing element 58 does not receive a significant amount of charge that is opposite the charge on another mobile device's sensing element. Sensing element 58 does not significantly impact the self-capacitance of another mobile device's sensing element. The other mobile device receives a logic '0' due to not detecting sensing element 58.

Figure 8A:
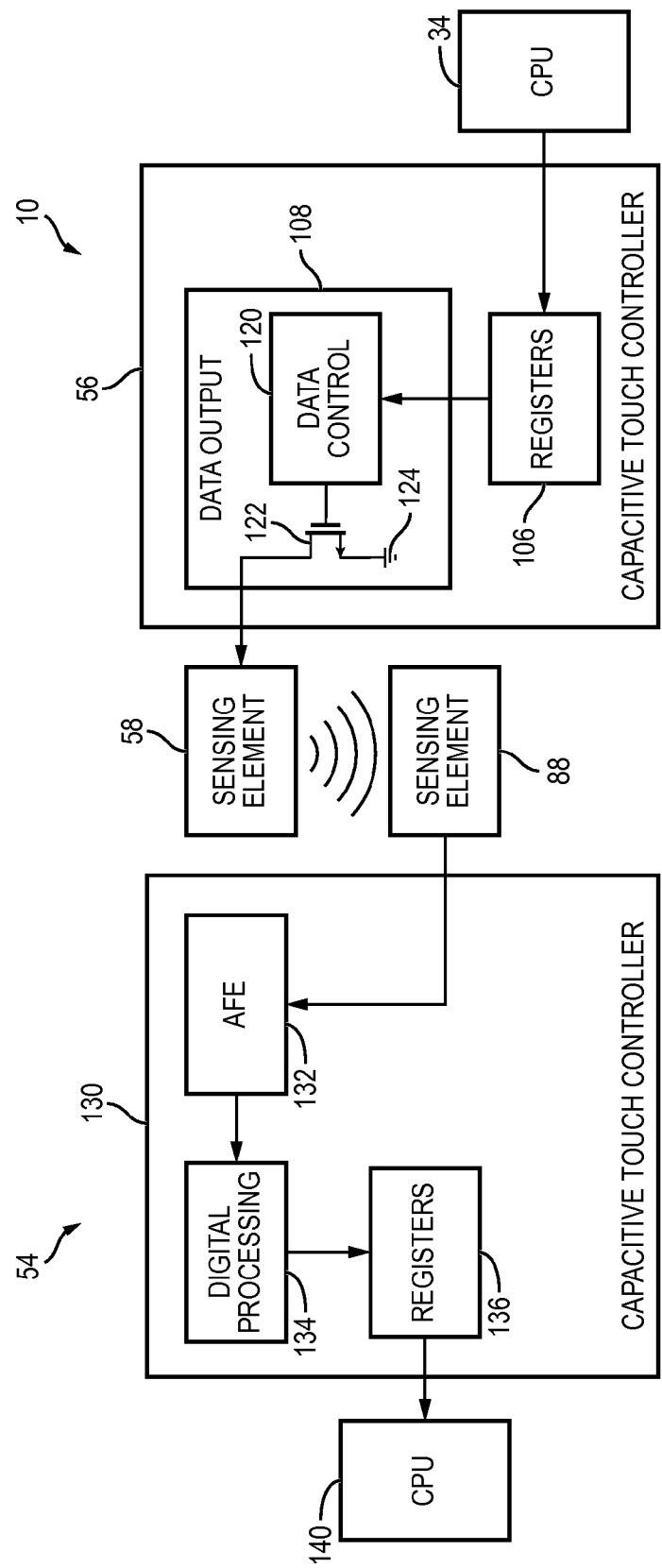
FIGS. 8a-8b illustrate transmitting data between two mobile devices using capacitive NFC.

FIG. 8a illustrates the parts of capacitive touch controllers used when mobile device 10 transmits data to mobile device 54 via capacitive NFC. In other embodiments, mobile device 10 communicates with other devices over capacitive NFC, such as retail point-of-sale (POS) systems, advertising kiosks, security systems, motor vehicles, workout equipment, home automation equipment, and other devices equipped with a capacitive touch controllers similar to capacitive touch controllers 56 and 130.

CPU 34 initiates a data transfer. In one embodiment, CPU 34 controls the timing and data rate of capacitive NFC transmission, as well as handshaking with mobile device 54. When CPU 34 controls timing, CPU 34 first writes to a bit in registers 106 to switch MUX 110 and connect data output 108 to sensing element 58. Once data output 108 is connected to sensing element 58, CPU 34 controls switch 122 by writing to another bit in registers 106. CPU 34 connects sensing element 58 to ground node 124 by writing a logic '1' to the bit, and puts sensing element 58 in high impedance by writing a logic '0' to the bit. In other embodiments, capacitive touch controller 56 handles timing, data rate, and handshaking with capacitive touch controller 130 of mobile device 54. CPU 34 writes a byte or word of data to registers 106 and capacitive touch controller 56 transmits the data.

Registers 106 include memory elements used to store data for transmission via capacitive NFC. CPU 34 writes a bit, byte, word, or multiple bytes or words, to the memory elements in registers 106 for transmission. In one embodiment, CPU 34 writes a byte to registers 106. Data output 108 transmits the byte using sensing element 58, and then CPU 34 is interrupted to send another byte to transfer. In another embodiment, registers 106 include a FIFO which CPU 34 writes to until the FIFO is full. Data output 108 transmits the data located in the FIFO in the same order which CPU 34 wrote the data. If the FIFO becomes full, CPU 34 is interrupted when the FIFO is no longer full to continue writing data.

Data output 108 reads a piece of data from registers 106 which instructs data control 120 how switch 122 is to be operated. In embodiments where CPU 34 handles data rates and handshaking, the register bit in registers 106 which CPU 34 uses to control sensing element 58 is coupled to the gate of switch 122. In embodiments utilizing a FIFO in registers 106, data output 108 receives a signal from the FIFO indicating data has been received from CPU 34. Data output 108 pops the next piece of data to be transmitted off the FIFO and stores the data into data control 120.

Data control 120 operates switch 122 as necessary to transmit data over capacitive NFC using sensing element 58. In some embodiments, data control 120 is a pass-through connecting a gate of switch 122 to a bit in registers 106 controlled by CPU 34. In other embodiments, data control 120 contains a multi-bit memory element used to temporarily store the next piece of data to transmit. Data control 120 updates the state of switch 122 for each bit using timing which mobile device 54 expects to properly receive the data. Switch 122 switches sensing element 58 between being coupled to ground to transmit a logic '1' and being high impedance to transmit a logic '0'.

Mobile device 10 and mobile device 54 are placed close to each other with sensing element 58 in proximity to sensing element 88. When sensing element 58 is coupled to ground node 124, sensing element 58 has a significant effect on the self-capacitance of sensing element 88, and proximity is detected by capacitive touch controller 130. When sensing element 58 is high impedance, sensing element 58 does not have a significant impact on the self-capacitance of sensing element 88, and no proximity is detected.

AFE 132 measure the self-capacitance of sensing element 88, and outputs a digital value approximately proportional to the capacitance attributable to sensing element 58 to digital processing unit 134. Digital processing unit 134 compares the digital value from AFE 132 to a threshold value in registers 136 to determine whether proximity is detected or not, i.e., whether a logic '1' is being transmitted by mobile device 10, or a logic '0'. In one embodiment, digital processing unit 134 sets a proximity status bit in registers 136. CPU 140 is interrupted to read the proximity status, which contains the bit transmitted by mobile device 10. CPU 34 collects individual bits from the proximity status bit in registers 136 and concatenates the bits into bytes, words, or other data structures for further processing by the CPU. In another embodiment, digital processing unit 134 stores the bits as bytes or words in registers 136, and CPU 34 is interrupted when an entire data structure is received.

Figure 8B:
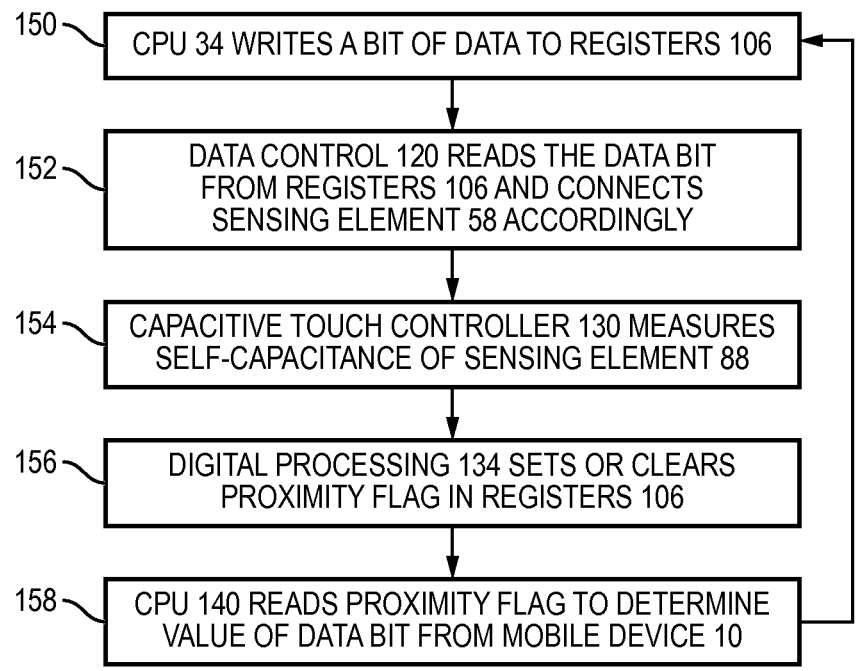

FIG. 8b illustrates a method of transmitting data from mobile device 10 to mobile device 54 one bit at a time using capacitive NFC. In step 150, mobile device 10 initiates the transmission of a bit of data by CPU 34 writing the bit to be transferred to a hardware register in registers 106. In one embodiment, CPU 34 waits a predetermined period of time before writing a bit to registers 106 to ensure that a previously transmitted bit is received by mobile device 54. The period of time to wait between transmitting two bits is set by a capacitive NFC standard or negotiated by mobile device 10 and mobile device 54 prior to beginning data transmission. In other embodiments, CPU 34 writes more than a single bit to registers 106 at once.

In step 152, data control 120 reads or receives the bit of data from registers 106 and controls switch 122 to connect sensing element 58 to ground node 124 or high impedance. If CPU 34 wrote a logic '0' to registers 106, data control 120 opens switch 122 to put sensing element 58 in a high impedance state. When sensing element 58 is set to high impedance, sensing element 58 does not have a significant effect on the self-capacitance of sensing element 88, and mobile device 54 does not detect proximity. If CPU 34 wrote a logic '1' to registers 106, switch 122 is closed and sensing element 58 is coupled to ground node 124. When sensing element 58 is coupled to a ground potential, sensing element 58 does have a significant impact on the self-capacitance of sensing element 88. Mobile device 54 detects proximity.

In one embodiment, an output of the physical memory device in registers 106 which is used by CPU 34 to transmit a bit of data is coupled to the gate of switch 122. CPU 34 directly controls the state of switch 122 by writing to registers 106. In embodiments where CPU 34 writes multiple transfer bits at a time to registers 106, data control 120 is responsible for receiving multiple bits from registers 106 and sending each bit one at a time according to the protocol being used between mobile device 10 and mobile device 54.

In step 154, capacitive touch controller 130 performs proximity detection. AFE 132 operates similarly to AFE 102, cancelling the environmental self-capacitance of sensing element 88 to leave the portion of self-capacitance attributable to sensing element 58, Cuser. AFE 132 includes an analog to digital converter which outputs a digital value proportional to Cuser to digital processing unit 134. Digital processing unit 134 operates similarly to digital processing unit 104, and compares Cuser to a threshold configured in registers 136 by CPU 140 to determine whether proximity is sensed or not. If Cuser is greater than or equal to the threshold, capacitive touch controller 130 detects proximity and a logic '1' is written to the proximity status bit. If Cuser is less than the threshold, proximity is not detected and a logic '0' is written to the proximity status bit. CPU 140 is interrupted when the new proximity status is stored.

In one embodiment, CPU 140 configures capacitive touch controller 130 for an increased proximity detection frequency for a higher data transfer rate. In some embodiments, CPU 140 configures capacitive touch controller 130 into a data receive mode. Capacitive touch controller 130 does not interrupt CPU 140 each time proximity is read, but instead collects bits from proximity readings into bytes, words, or other amounts of data as configured by CPU 140. When an entire byte or word is collected by capacitive touch controller 130, CPU 140 is interrupted to read the byte or word instead of a single bit.

In step 158, CPU 140 reads the memory mapped proximity flag in registers 106. CPU 140 is in a state expecting to receive data, and correctly treats the proximity status flag as the next bit of data from mobile device 10. CPU 140 collects the data bits received from mobile device 10 into bytes, words, or other data structures usable by CPU 140.

Figure 9A:
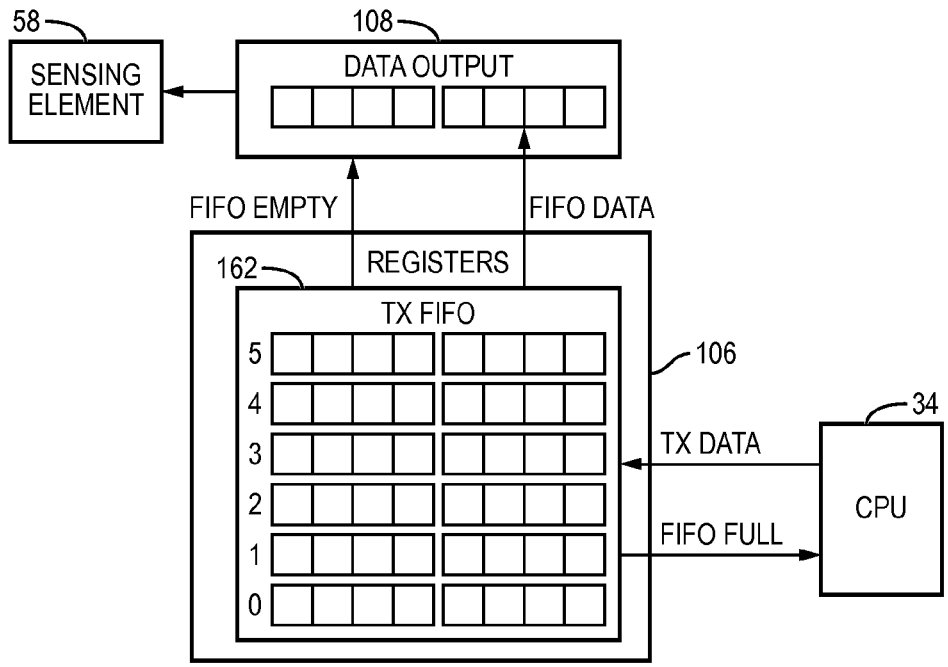
FIGS. 9a-9b illustrate FIFOs used to transmit and receive data over capacitive NFC.

FIG. 9a illustrates transmit (TX) FIFO 162 used by mobile device 10 to transmit data to another device via capacitive NFC. TX FIFO 162 is illustrated as holding 6 pieces of data, with each piece of data being one byte. In other embodiments, TX FIFO 162 is smaller or larger. In one embodiment, TX FIFO 162 holds 1024 pieces of data, with each piece of data being a 32-bit word. CPU 34 initiates a transfer to another mobile device by writing a byte to TX FIFO 162. Data output 108 is notified that TX FIFO 162 contains data by a FIFO empty flag from the TX FIFO being a logic '0'. Data output 108 reads a byte of data from TX FIFO 162 and transmits the data one bit at a time by toggling sensing element 58 between ground and high impedance.

While data output 108 is busy transmitting the first byte written by CPU 34, the CPU continues to write data to TX FIFO 162. CPU 34 continues writing data to be transmitted to TX FIFO 162 until the TX FIFO contains the next 6 bytes to be transmitted. When TX FIFO 162 contains 6 bytes to be transmitted, the TX FIFO is full. CPU 34 is notified that TX FIFO 162 is full by a FIFO full flag which becomes a logic '1'. CPU 34 continues to write data to be transmitted when the FIFO full flag returns to a logic '0'. In some embodiments, the FIFO full flag returns to a logic '0' when one byte is available in TX FIFO 162. In other embodiments, CPU 34 configures capacitive touch controller 56 with a specific number of bytes which are available in TX FIFO 162 when the CPU is interrupted.

TX FIFO 162 includes two address pointers, one address pointer for writes by CPU 34 and one address pointer for reads by data output 108. When mobile device 10 is reset, the read pointer and write pointer are set to address 0, and the FIFO empty flag is a logic '1'. CPU 34 writes to a single address in capacitive touch controller 56, and the data written goes to the address in TX FIFO 162 indicated by the write pointer. When CPU 34 writes a byte to TX FIFO 162, the write pointer is incremented to address 1 while the read pointer remains at address 0. The FIFO empty flag is set to a logic '0'. When data output 108 reads the byte from TX FIFO 162, the read pointer increments to address 1, and the write pointer remains at address 1. The FIFO empty flag is set to a logic '1'.

As CPU 34 continues to write data into TX FIFO 162, the write pointer increments for each byte written. After CPU 34 writes to address 5, the write pointer returns to address 0 and the CPU writes the next byte to address 0. When CPU 34 writes to address 0, the FIFO full flag to CPU 34 is asserted. The read pointer has remained at address 1, indicating that address 1 still contains data to be transmitted. The FIFO full flag is set so that CPU 34 does not overwrite the data in address 1 which has not been transmitted. As data output 108 continues to read data from TX FIFO 162 and transmit the data via sensing element 58, the read pointer increments for each byte read from the TX FIFO. Eventually, the read pointer catches up to the write pointer and all pending data has been transmitted. The FIFO empty flag is asserted to alert data output 108 that no more data is available to be transmitted.

Figure 9B:
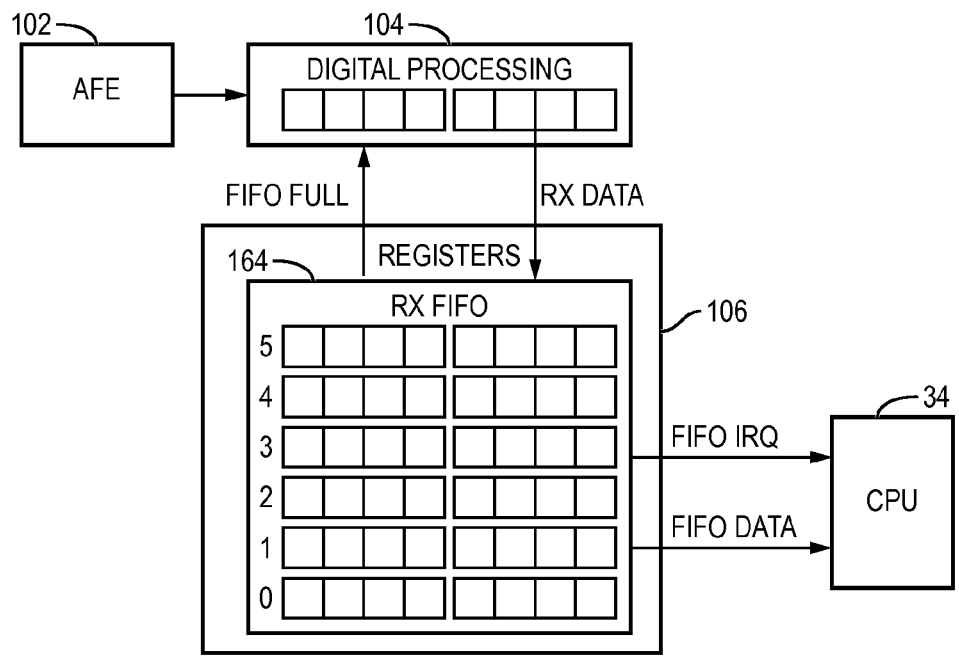

FIG. 9b illustrates receive (RX) FIFO 164 used by capacitive touch controller 56 to collect data received over capacitive NFC. In some embodiments in which data is transmitted in one direction at a time, the same FIFO is used for RX FIFO 164 and TX FIFO 162. The FIFO is reconfigured between an RX and TX mode by changing which module is writing to the FIFO and which module is reading from the FIFO. RX FIFO 164 is illustrated as holding 6 pieces of data, with each piece of data being one byte. In other embodiments, RX FIFO 164 is smaller or larger. In one embodiment, RX FIFO 164 holds 1024 pieces of data, with each piece of data being a 32-bit word. A data transfer is initiated by CPU 34 setting capacitive touch controller 56 into a data receive mode. Each subsequent bit is read, one at a time, by capacitive touch controller 56 performing a capacitive proximity reading. In one embodiment, CPU 34 configures automatic periodic proximity detection at the same rate at which another device is configured to send data.

To detect proximity, AFE 102 generates a digital value approximately proportional to Cuser, i.e., the portion of the self-capacitance of sensing element 58 attributable to another device. Digital processing unit 104 receives the digital Cuser value from AFE 102, and compares the Cuser value to a threshold value to determine whether the transmitting device is sending a logic '1' or a logic '0'. If the Cuser value is equal to or greater than a threshold for detecting proximity, proximity is detected and a logic '1' is received. If the Cuser value is less than a threshold for detecting proximity, no proximity is detected and a logic '0' is received.

Digital processing unit 104 collects the received bits in a temporary register until a full byte has been received. When the temporary register is full with 8 bits of received data, the received byte is written to RX FIFO 164. Digital processing unit 104 continues to receive data and store the data in RX FIFO 164 until the RX FIFO asserts the FIFO full flag to digital processing unit 104. If RX FIFO 164 is full, storing additional data in the RX FIFO overwrites existing data. CPU 34 transmits a message to the other device to stop sending additional data, and to resend any data which was transmitted between RX FIFO 164 becoming full and the stop message being received by the other device.

When received data is available in RX FIFO 164, a FIFO IRQ is asserted to CPU 34 to alert the CPU that data is available to be read from the RX FIFO. CPU 34 reads bytes from RX FIFO 164 until the RX FIFO is empty, and performs any operation necessary on the received data. RX FIFO 164 operates similarly to TX FIFO 162, with a write pointer incremented each time digital processing unit 104 stores a received byte in the RX FIFO, and a read pointer which is incremented each time CPU 34 reads a byte.

Capacitive NFC using proximity sensors commonly found in mobile devices allows secure transfer of data between multiple devices in close physical proximity. Utilizing proximity sensors which are already commonly used in mobile devices reduces the expense and complexity of manufacturing mobile devices, and also reduces battery usage, compared to existing inductive NFC. Two mobile devices, or one mobile device and another type of device, are placed close together with sensor elements facing each other. The receiving side performs successive capacitive sensing measurements while the transmitting side toggles the sensing element between a ground potential and high impedance, which generates the bitstream to be sent. To get a higher bitrate, the receiving side performs faster capacitance measurements while the transmitting side toggles the sensing element between ground potential and high impedance faster.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a mobile device, comprising:
providing a conductive element;
providing a multiplexer with the conductive element coupled to a first terminal of the multiplexer;
providing a ground node;
providing a switch coupled between the ground node and a second terminal of the multiplexer;
providing a first memory element configured to control the switch; and
providing a capacitive touch controller coupled to a third terminal of the multiplexer and configured to measure a capacitance of the conductive element.

2. The method of claim 1, further including configuring the conductive element to be detected by a proximity sensor of a second mobile device.

3. The method of claim 1, wherein providing the first memory element includes providing a data output configured to receive a byte of data and output the byte of data one bit at a time by toggling a control terminal of the switch.

4. The method of claim 1, further including providing a digital processing unit configured to convert the capacitance of the conductive element to a bit of data.

5. The method of claim 4, further including providing a second memory element configured to store the bit of data.

6. The method of claim 1, further including configuring the multiplexer to couple the conductive element to the switch in a transmit mode of the mobile device and to the capacitive touch controller in a receive mode of the mobile device.

7. A method of making a mobile device, comprising:
providing a conductive element on the mobile device configured to allow a second mobile device to detect the conductive element by measuring a capacitance between the second mobile device and the conductive element;
providing a ground node;
providing a switch coupled between the conductive element and ground node; and
providing a first memory element configured to transmit a bit of data by using the switch to toggle the conductive element between being connected to the ground node and being in a high impedance state, wherein a binary value written to the first memory element controls the switch to transmit the bit of data to the second mobile device.

8. The method of claim 7, further including configuring the conductive element to be detected by a proximity sensor of the second mobile device.

9. The method of claim 7, wherein providing the first memory element includes providing a register bit coupled to a control terminal of the switch.

10. The method of claim 7, further including providing a digital processing unit configured to convert a value of a capacitance of the conductive element to a bit of data received from a second mobile device.

11. The method of claim 10, further including providing a second memory element configured to store the bit of data.

12. The method of claim 7, further including:
providing a multiplexer comprising a first terminal coupled to the switch and a second terminal of the multiplexer coupled to the conductive element; and
providing an analog front-end coupled to a third terminal of the multiplexer, wherein the multiplexer selectively couples the conductive element to the analog front-end or the switch.

13. A method of making a mobile device, comprising:
providing a first conductive element;
providing a ground node; and
providing a switch coupled between the first conductive element and ground node with the switch configured to toggle the first conductive element between a high impedance state and being connected to the ground node to transmit data to a second mobile device that receives the data by measuring an effect of the first conductive element on a self-capacitance of the second mobile device.

14. The method of claim 13, further including configuring the first conductive element to be detected by a proximity sensor of the second mobile device.

15. The method of claim 13, further including providing a register bit coupled to a control terminal of the switch.

16. The method of claim 13, further including:
providing a data output configured to control the switch; and
providing a FIFO configured to provide data to the data output.

17. The method of claim 13, further including:
providing a capacitive touch controller on the second mobile device;
providing a second conductive element on the second mobile device coupled to the capacitive touch controller; and
successively measuring the self-capacitance of the second conductive element by modifying a voltage potential of the second conductive element and determining an amount of electrical charge provided on the second conductive element in modifying the voltage potential.

18. The method of claim 17, further including providing a digital processing unit configured to convert the successive self-capacitance measurements of the first conductive element to successive bits of data.

19. The method of claim 13, further including a multiplexer coupled between the switch and the first conductive element.

20. A mobile device, comprising:
- a conductive element;
- a multiplexer including a first terminal of the multiplexer coupled to the conductive element;
- a ground node;
- a switch coupled between the ground node and a second terminal of the multiplexer; and
- a capacitive touch controller coupled to a third terminal of the multiplexer.

21. The mobile device of claim 20, further including a register bit coupled to a control terminal of the switch.

22. The mobile device of claim 20, further including a data output configured to control the switch.

23. The mobile device of claim 22, further including a FIFO configured to provide data to the data output.

24. The mobile device of claim 20, wherein the capacitive touch controller is configured to measure a capacitance of the conductive element.

25. The mobile device of claim 24, further including a digital processing unit configured to convert the capacitance of the conductive element to a bit of data.

* * * * *